United States Patent [19]

Fischer

[11] Patent Number: 5,324,331
[45] Date of Patent: Jun. 28, 1994

[54] TRANSPORT SYSTEM, IN PARTICULAR FOR TRANSPORTING SILICON MONOCRYSTALS THROUGH THE TANK OF A RESEARCH REACTOR

[76] Inventor: Florian Fischer, Kalteneck 3, Ebersberg D-8017, Fed. Rep. of Germany

[21] Appl. No.: 916,125
[22] PCT Filed: Dec. 19, 1990
[86] PCT No.: PCT/DE90/00976
§ 371 Date: Jul. 30, 1992
§ 102(e) Date: Jul. 30, 1992
[87] PCT Pub. No.: WO91/09996
PCT Pub. Date: Jul. 11, 1991

[30] Foreign Application Priority Data

Dec. 21, 1989 [DE] Fed. Rep. of Germany ....... 3942387

[51] Int. Cl.$^5$ .................... G21C 19/22; G21G 1/02
[52] U.S. Cl. .................. 29/25.01; 414/146; 414/DIG. 3; 414/DIG. 6; 376/183
[58] Field of Search ............... 414/DIG. 3, DIG. 6, 414/146; 29/25.01; 376/183

[56] References Cited

U.S. PATENT DOCUMENTS

| | | |
|---|---|---|
| 3,967,982 | 7/1976 | Arndt et al. ............... 437/22 |
| 4,042,454 | 8/1977 | Haas et al. ............... 437/17 |
| 4,129,463 | 12/1978 | Cleland et al. ............ 437/17 |
| 4,733,631 | 3/1988 | Boyarsky et al. .......... 118/715 |
| 4,910,156 | 3/1990 | Takasu et al. ............. 376/183 |
| 5,048,164 | 9/1991 | Harima ...................... 29/25.01 |

Primary Examiner—Robert Kunemund
Assistant Examiner—Ourmazd S. Ojan
Attorney, Agent, or Firm—Nies, Kurz, Bergert & Tamburro

[57] ABSTRACT

The invention pertains to a transport system for transporting containers or products within and along an essentially vertical tube with concurrent rotation of the containers on the axis of the tube. In order to facilitate simple construction despite conditions of limited space, it is proposed that the tube be designed as a vertical rotary tube, to which a rotatably retained worm sleeve is connected at the end of the transport path. Provided within the rotary tube are longitudinal guide grooves, in which dogs carried by the containers engage. These dogs also engage in the screw thread of the worm sleeve. On their upper and lower sides, the containers have couplings, e.g., an end toothing, which, during the transport of a group of adjoining containers, impart a rotary movement from container to container but also make possible a separation of one container from another in the direction of the axis of the tube. During a rotation of the rotary tube, the containers are successively rotated through by the worm sleeve, which can accommodate least one container. The transport system is especially suited for transporting silicon monocrystals, which are enclosed within the containers, through the heavy water tank of a research reactor for doping said silicon monocrystals by way neutron bombardment.

9 Claims, 3 Drawing Sheets

TRANSPORT SYSTEM, IN PARTICULAR FOR TRANSPORTING SILICON MONOCRYSTALS THROUGH THE TANK OF A RESEARCH REACTOR

BACKGROUND OF THE INVENTION

The invention pertains to a transport system for transporting containers through a reactor basin. More particularly, the invention relates to a transport system for transporting containers or products within and along an essentially vertical tube, such as containers packed with semiconductor monocrystals, with concurrent rotation of the containers on the axis of the tube. Such a transport system is used, e.g., in research reactors, in which silicon monocrystals are doped with phosphorus by neutron bombardment. Therein, the silicon crystals are arranged in containers, which are transported along and within a vertical tube traversing the heavy water tank of the reactor basin. In order to achieve the most uniform radiation possible, the containers are also rotated on the axis of the tube. This is accomplished, e.g., by means of a long rod, to which the containers are affixed and then pushed through and rotated within the tube.

Such transport systems can also be used, e.g., in bioreactors or in galvanizing facilities. Due to the limited space usually available, care must be given to space-saving construction in all applicatory possibilities. In particular, the aggressive environment, which is partially dependent upon the reason for the treatment, e.g., radioactivity or aggressive liquids, dictates a sensible selection of the materials employed and a construction, which is as simple as possible, easy to maintain, and long-lived.

In the case of the aforementioned doping of semiconductor crystals in a reactor, the possibility should also be given for executing this doping as uniformly as possible and continuously, i.e., that each container passing through the reactor is subjected to approximately the same radiation conditions, and that a high feed capacity is nevertheless attained.

SUMMARY OF THE INVENTION

Fundamental to the invention is an objective of so designing a transport system of the type in question that a high feed capacity is attained with simple construction, and that the transport system can also be employed in aggressive environments.

Accordingly, the transport system consists of three units, namely a rotary tube, a worm sleeve, and the containers transported In the rotary tube and the worm sleeve. The rotary tube, in which the containers are non-rotatably retained, is responsible for the rotary movement of the containers, while the worm sleeve is responsible for the transport of the containers along the axis of the tube. The gliders of a container within the worm sleeve engage in and are tightened into the screw threads of the worm sleeve, since the rotational movement of the rotary tube is imparted by couplings between the containers. Following the passage of a given container through the worm sleeve, it is accepted by a receiver and optionally transported further.

When containers holding silicon crystals are to be transported through the heavy water tank of a reactor, the rotary tube and the worm sleeve are themselves contained within a passage tube through the heavy water tank. The rotary tube can be rotatably supported on a shoulder of the passage tube, while it is preferred for reasons of safety that use be made of a support at the bottom of the rotary tube, which extends out from the base of the reactor basin.

The described transport system makes possible the continuous transport of a progression of containers along the rotary tube and the worm sleeve. In the radiation of silicon monocrystals in a reactor, assurance is given thereby that all of the crystals are continuously radiated in the same manner.

For other applications, it is necessary that the tubes and the containers be made of uniform material; e.g., for the transport of products through galvanizing baths, it is essential that the individual components of the conveyor system be made of a mesh material, so that the galvanizing liquid can also reach the interior of the containers, It is also possible that a product to be transported be placed directly into the rotary tube, provided care is taken to ensure that said product is provided with couplings and appropriate gliders, which engage in the guide contrivances of the rotary tube.

BRIEF DESCRIPTION OF THE DRAWINGS

The invention is described in greater detail by way of an embodiment example and references to the appended drawings. Depicted in these are.

DESCRIPTION OF THE PREFERRED EMBODIMENTS

Figure 1:
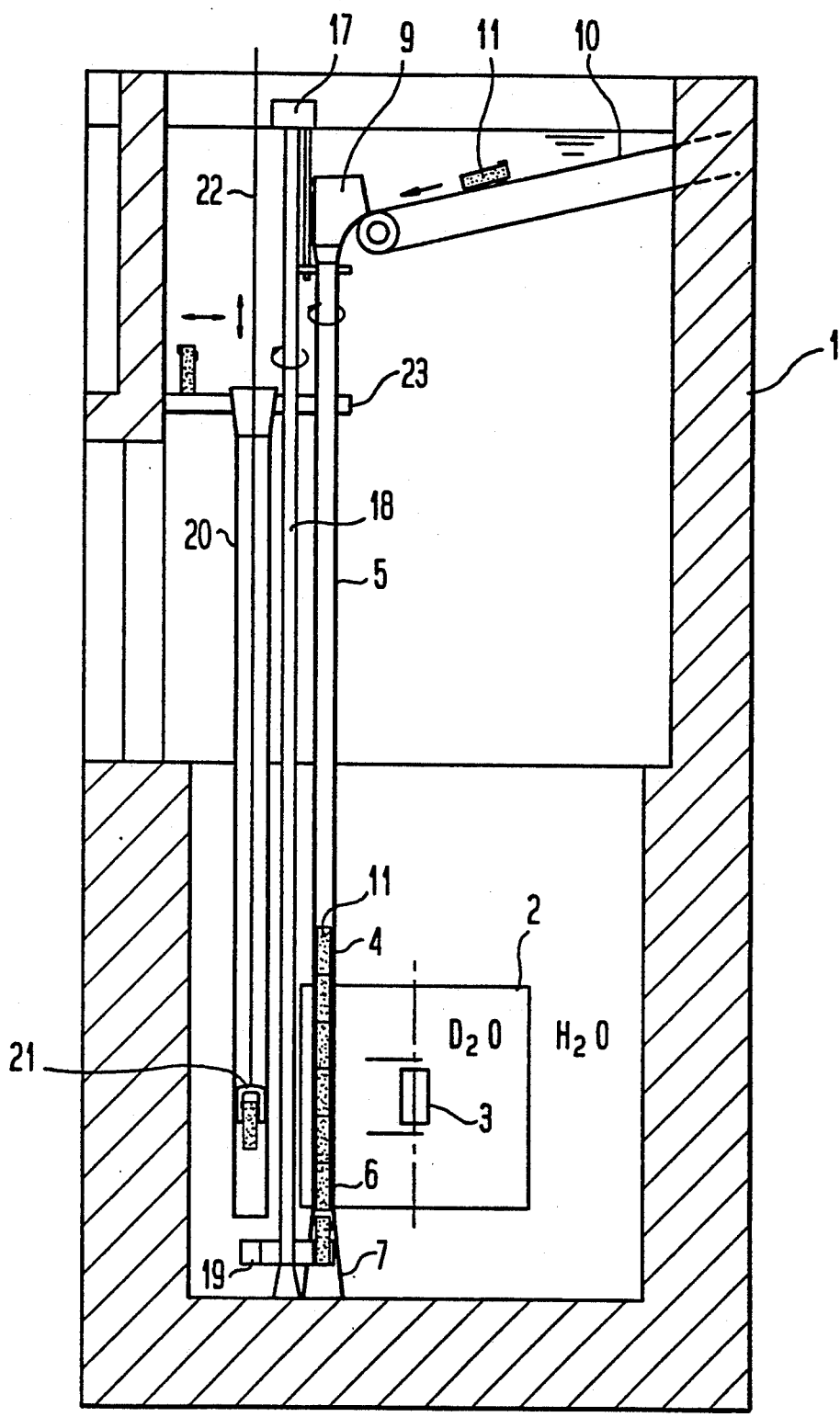
FIG. 1, a schematic cross section through a research reactor, in which a transport system in keeping with the invention is installed, while silicon monocrystals enclosed in containers are transported by this transport system along a vertical rotary tube passing through the heavy water tank of a research reactor.
Figure 2:
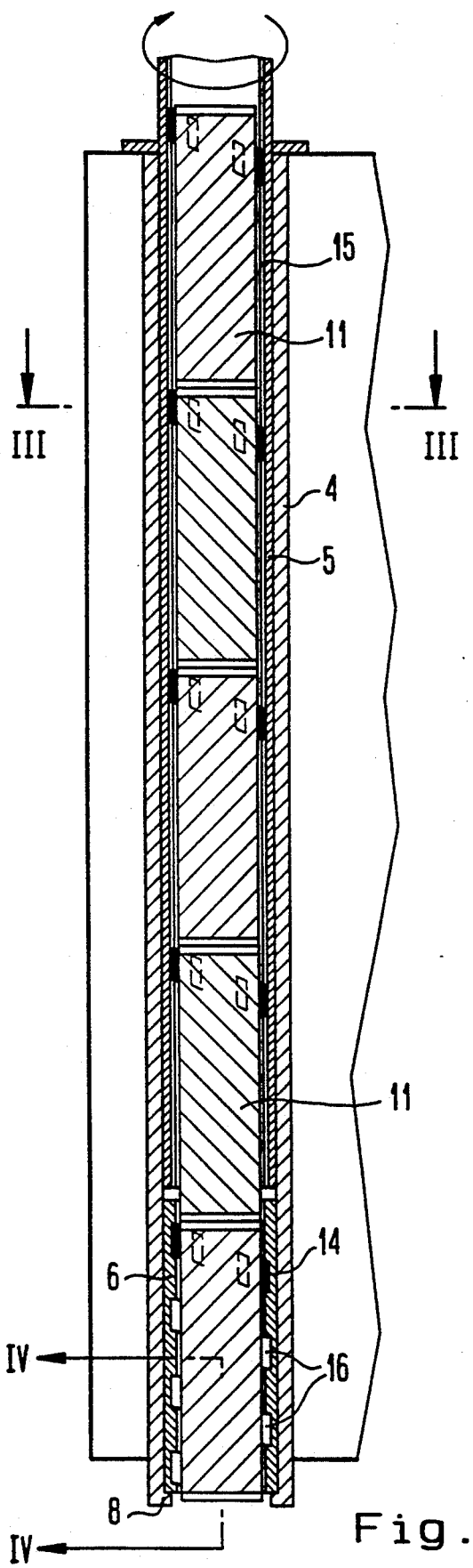
FIG. 2, a detailed illustration of the transport system in the area of the heavy water tank.
Figure 3:
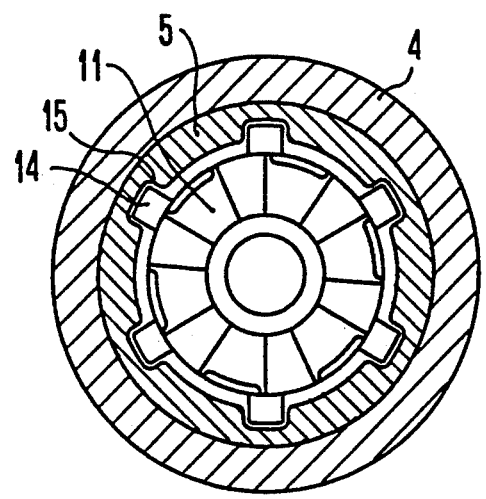
FIG. 3, across section along line III — III in FIG. 2.
Figure 4:
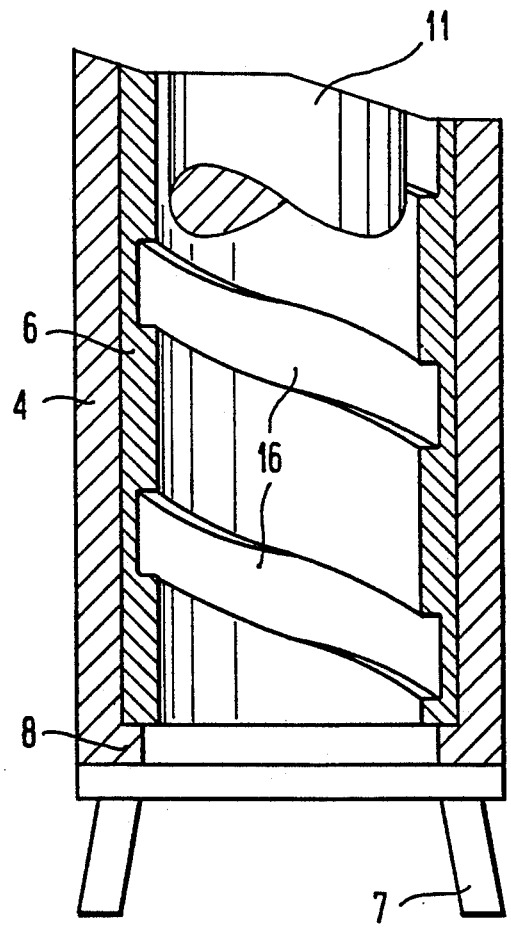
FIG. 4, a partially cut-away cross section along line IV—IV in FIG. 2.
Figure 6:
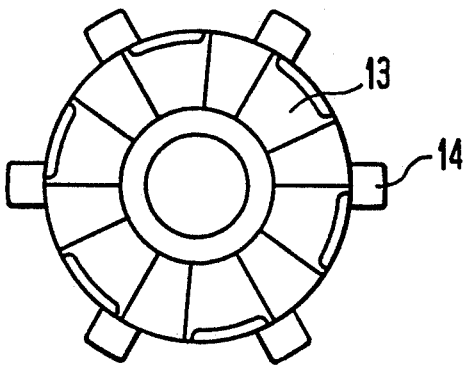
FIG. 6, a frontal view of the upper or the lower side of a container for the transport system.

Situated in the vicinity of the base of a reactor basin (1) filled with water is a heavy water tank (2), in which heavy water and, in the center, the core (3) of the reactor are located. Traversing the heavy water tank (2) at one side and sealed off from the tank is a vertical passage tube (4), in which a rotary tube (5) engages at the top and in which a worm sleeve (6) is mounted at the other end. The rotary tube (5) and the worm sleeve (6) are coaxial and have an outer diameter approximately matching the inner diameter of the passage tube (4). The worm sleeve (6) is non-rotatably carried in the passage tube (4) and as depicted in FIG. 4, is secured by a support construction reaching to the base of the reactor basin. In addition, the worm sleeve can be supported by a base flange (8) of the passage tube (4). The rotary tube (5) extends to slightly below the surface of the water and has, at its upper end, a guide cone ( 9 ), to which a conveyor belt (10) running obliquely upward out of the reactor basin is adjoined, by means of which containers (11) can be transported and introduced into the rotary tube via the guide cone (9). The containers (11) are cylindrical cans and each has a lid (12) at the upper end, while both the base and the lid are provided with end toothing (13), as illustrated in FIG. 6, i.e., with alternating higher and lower flattened segments. When two containers are in contact, as shown in FIGS. 1 and 2, these end toothings engage and hold the two containers (11) together and against relative rotation. Distributed around the periphery, and in this case at the top, each container has a number of dogs (14), in this case six, which engage in corresponding guide grooves (15) of the rotary tube (5), while these guide grooves (15) run in the longitudinal direction of the rotary tube. At the periphery the container, the dogs (14) are arranged along a threaded passage, which has the same inclination as a threaded groove (16) provided in the inner wall of the worm sleeve (6); cf. FIG. 4.

A rotary drive (17) for the rotary tube (5) is provided at the upper end of the reactor basin (1), with which the tube can be continuously rotated on its longitudinal axis. A transfer carousel shaft (18) parallel to the rotary tube also extends from the rotary drive to a transfer carousel (19), which is situated beneath the worm sleeve (6). At the side of the transfer carousel shaft (18) facing away from the rotary tube (5) is a guide tube (20), in which a gripper (21) can be maneuvered with the help of a gripper cable ( 22 ). The guide tube (20) ends still inside the reactor basin in the vicinity of a support platform (23).

The functioning of the described transport system is as follows:

Several containers are introduced through the feed cone (9) by the conveyor belt (10), wherein care must be taken that all of the containers are introduced into the rotary tube in the same orientation. The containers sink in the rotary tube (5) along the guide grooves (15) and are appropriately braked thereby, since the water in front of them must be displaced through the gap between the rotary tube and the outer wall of the containers. It is assumed that, as shown in FIGS. 1 and 2, five containers (11) are located within the span of the passage tube (4), one of which is already inserted into the worm sleeve. It is apparent that the dogs (14) of this container are engaged in the threaded groove (16). As a result of the rotation of the rotary tube (5), by which the containers (11) are advanced due to the engagement of the dogs (14) in the guide grooves (15), and of the transfer of this rotary motion due to the end toothing (13), the containers (11) located within the worm sleeve (6) are rotated through the worm sleeve, while the surmounted containers follow downward under their own weight.

When the lowest container (11) has passed through the worm sleeve (6), it is received by the transfer carousel (19), advanced by the transfer carousel shaft beneath the guide tube (20), grasped by the gripper (21), lifted onto the support platform (23), and there deposited. In this position, the container together with its contents, in this case silicon monocrystals, can be left to undergo decay for about three days.

As soon as the container located within the worm sleeve (6) leaves the latter, the dogs ( 14 ) of the succeeding container engage in the screw thread (16), so that this container is also rotated through the worm sleeve. In this manner, a continuous transport of all of the containers through the heavy water tank is achieved, while the containers are also uniformly rotated. The duration of the transport of each container through the heavy water tank, the length of which is approximately 2.5 meters, should be about three hours. Commensurate therewith are the resulting rotary speed of the rotary tube and then the inclination of the screw thread (16). Accordingly, the worm is designed to be self-retaining. When there is then no forced feed by the rotation of the rotary tube (5) the containers (11) remain in their given position. At the conclusion of the process, the rotary tube is filled with containers (11), in which a moderator, e.g., graphite or beryllium, is packed, so that only a minimal quantity of light water penetrates the passage tube.

Figure 5:
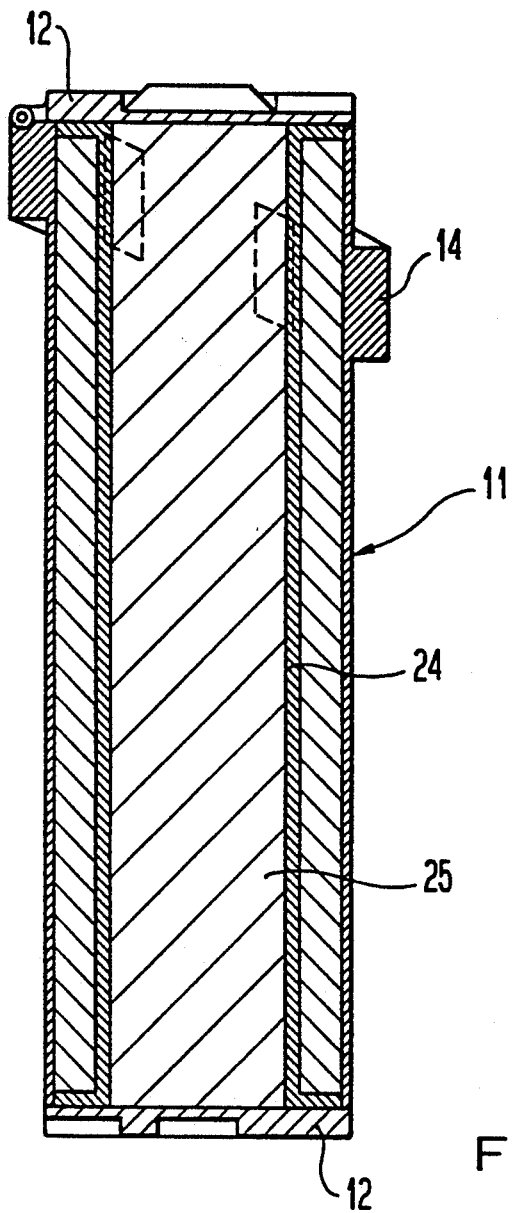
FIG. 5, a longitudinal section through a-here modified— container for a transport system in keeping with the invention.

Packed in the cylindrical containers (11) are cylindrical silicon monocrystals 50 centimeters long and approximately 15 centimeters in diameter, which completely fill the inner cavity of the containers. Nevertheless, it is also possible to pack the interior of the containers with small silicon crystals or with other products. For this purpose and as illustrated in FIG. 5, an insert ( 24 ) can be used in the container ( 11 ), which accommodates a smaller silicon monocrystal (25).

All parts of the described conveyor system are made of materials which undergo rapid decay following passage through the heavy water tank. Especially suitable for this purpose is aluminum; beryllium would also be possible, which should be used only in exceptional cases, however, because of the toxic effect of beryllium dust.

All components of the described transport system, especially those subjected to radiation in the heavy water tank, can be made of a single material, preferably aluminum, while the gliding sleeve bearings should be hard oxidized anodically. In the case of the operating system, a mounting of the components subject to wear is possible, especially the rotary tube and the worm sleeve, which permits exchange of these parts even during operation of the reactor.

Modifications of the described transport system are, of course, possible. For instance, the length of the worm sleeve could be such that it extends beyond just a single container. Additionally, a multiple threading could be provided instead of the single screw groove in the guide container, and in that case it would even be possible that the dogs (14) engage not along a single threaded groove but rather all at the same level along a circle at the periphery of the container.

Furthermore, it would be possible that the transfer of the rotary movement from container to container be by way of friction, in addition to positive engagement.

Although, as described above, the screw grooves are provided on the inner wall of the worm sleeve and the engaging counterparts are designed as grippers on the outer walls of the containers, an opposite resolution is naturally possible, so that the containers have an outer threading and the worm sleeve has corresponding grippers. Similarly, the guide contrivances inside the rotary tube would then be correspondingly designed.

I claim:

1. A container transport system for transporting containers axially within and along on essentially vertical tube, such as for the transport through a reactor basin of containers packed with semiconductor monocrystals for doping the monocrystals, said system comprising:
   a) a substantially vertical guide tube supported for rotation about it own axis, the guide tube including first, inner guide means for guiding a container for axial movement within and along the guide tube;
   b) a container having a size to permit the container to pass axially through the tube and having second, external guide means that are engagable with the first guide means for guiding the container for movement within the guide tube;

c) a non-rotatable tubular sleeve coaxial with and positioned adjacent a lower end of the guide tube, the sleeve having a cross-sectional size and shape sufficient to receive a container and having an inner guide groove for receiving the second guide means carried by the container;

d) the container including upper and lower coupling means for cooperative engagement with corresponding coupling means carried by an axially adjacent container to couple axially adjacent containers for simultaneous rotation and for permitting axial separation of adjacent containers.

2. A container transport system according to claim 1 wherein the first guide means extend in an axial direction within the guide tube.

3. A container transport system according to claim 1 wherein the inner guide groove of the tubular sleeve is a substantially helically disposed groove adapted to receive the second guide means carried by the container for guiding movement of the container along the sleeve.

4. A container transport system according to claim 2 wherein the first guide means includes a plurality of axially disposed grooves and the second guide means includes a plurality of outwardly extending dogs that are engagable with grooves of the first guide means.

5. A container transport system according to claim 4 wherein the sleeve includes a plurality of substantially helically disposed inner guide grooves that are engagable with the dogs of the container.

6. A container transport system according to claim 1 wherein the upper and lower coupling means include alternating sector-shaped projections and recesses.

7. A container transport system according to claim 1 wherein the tubular sleeve is supported only at its base.

8. A container transport system according to claim 1 wherein the guide tube and the sleeve are positioned within a reactor basin and pass through a heavy water tank within the reactor so that containers pass adjacent a reactor core.

9. A container transport system according to claim 1 including transfer means positioned at an outlet of the tubular sleeve to transfer a container away from an outlet of the sleeve.

* * * * *